United States Patent [19]
Tsai et al.

[11] Patent Number: 5,387,860
[45] Date of Patent: Feb. 7, 1995

[54] DETACHABLE COILS AIR CORE MOVEMENT HOLDER

[76] Inventors: Yen-Shu Tsai, 2F, No. 2-3, Alley 14, Lane 44, Hoshin Rd.; Min-Huang Chuang, 2F-2, No. 185, Taoshiang Road, both of Taipei, Taiwan, Prov. of China

[21] Appl. No.: 15,369

[22] Filed: Feb. 9, 1993

[51] Int. Cl.⁶ .................. G01R 5/16; G01R 1/20; H01F 27/28
[52] U.S. Cl. .................................................. 324/146
[58] Field of Search ................. 324/143–158; 336/198, 208

[56] References Cited

U.S. PATENT DOCUMENTS 5,243,277  9/1993  Totsuka et al. .................. 324/146

Primary Examiner—Gerard R. Strecker
Assistant Examiner—Warren S. Edmonds
Attorney, Agent, or Firm—Bucknam and Archer

[57] ABSTRACT

A detachable coils air core movement holder having aligned upper and lower holders defining a chamber therebetween for housing a magnet with a center shaft extending through the upper holder and coupled to a pointer of a meter. A plurality of horizontal projections extend from the periphery of the aligned upper and lower holders for mounting on each a bobbin having a coil wound thereon.

1 Claim, 3 Drawing Sheets

DETACHABLE COILS AIR CORE MOVEMENT HOLDER

BACKGROUND OF THE INVENTION

A variety of analog meters are known, and widely used for measuring and recording the quantity or rate of flow of gas, electricity, or water passing through it, by means of the operation of a movement and a pointer. In recent years, analog meters have been gradually replaced by digital meters. However, a digital meter is relatively expensive, and may be interfered by outside noises or ambient conditions. Further, a digital indicator meter is not suitable for use in motor vehicles because it is difficult to realize the quantity or rate by a glance. When a figure, for example: 35 KM or 65 KM was read out, one must use brains to judge if such figure represents a low speed or high speed. The pointer of an analog meter directly indicates the amount of movement, and its movement can be easily seen even when the intensity of ambient light is low.

The movement of an analog meter may be made from moving coil, moving iron or air core, etc. according to its purpose. An air core movement, as shown in FIG. 1, is also known as "cross coils movement", which comprises a center shaft connected to a permanent magnet at the center mounted within two vertically connected bobbins, and two coils A and B wound round the bobbins. Coil A is equally wound round the bobbins at two opposite sides relative to the center shaft. Coil B is wound round the bobbins crossed over coil A and equally arranged at two opposite sides relative to the center shaft. During the winding of coils A and B, the bobbins may be caused to deform. If the coils A and B deform the bobbins, the center shaft may be stuck during the operation. Further, if the number of turns of either coil A or B is not equally distributed at two opposite sides relative to the center shaft and the tension of either coil A or B is not uniformly distributed, the total impedance of coils A and B will be different, thereby causing a indication error. This coil winding method can not get rid of the effect of outside temperature. Further, coil A produces a poor heat dissipating effect because it is covered within coil B, thereby resulting in an unbalanced impedance. When the impedance is unbalanced, the accuracy of the indication will be affected. Because the coil winding process is difficult to perform, the manufacturing speed is hindered. Because this conventional production method can not eliminate high defective rate, a lot of time will be spent on correction. Furthermore, the application of the bonding agent to fasten the ends of the wires greatly increases material and labor costs.

The present invention has been accomplished under the aforesaid circumstances. It is therefore the main object of the present invention to provide a detachable coils air core movement holder which is inexpensive to manufacture, and easy to assembly.

DETAILED DESCRIPTION OF THE PREFERRED EMBODIMENT

Figure 1:
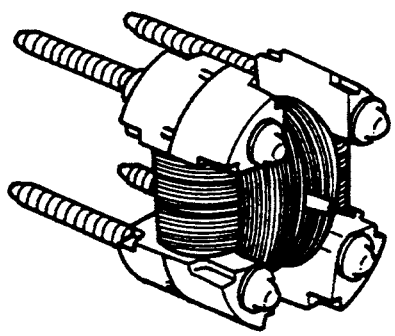
FIG. 1 is a perspective view of a prior art cross coils movement holder with the coil thereon.
Figure 2:
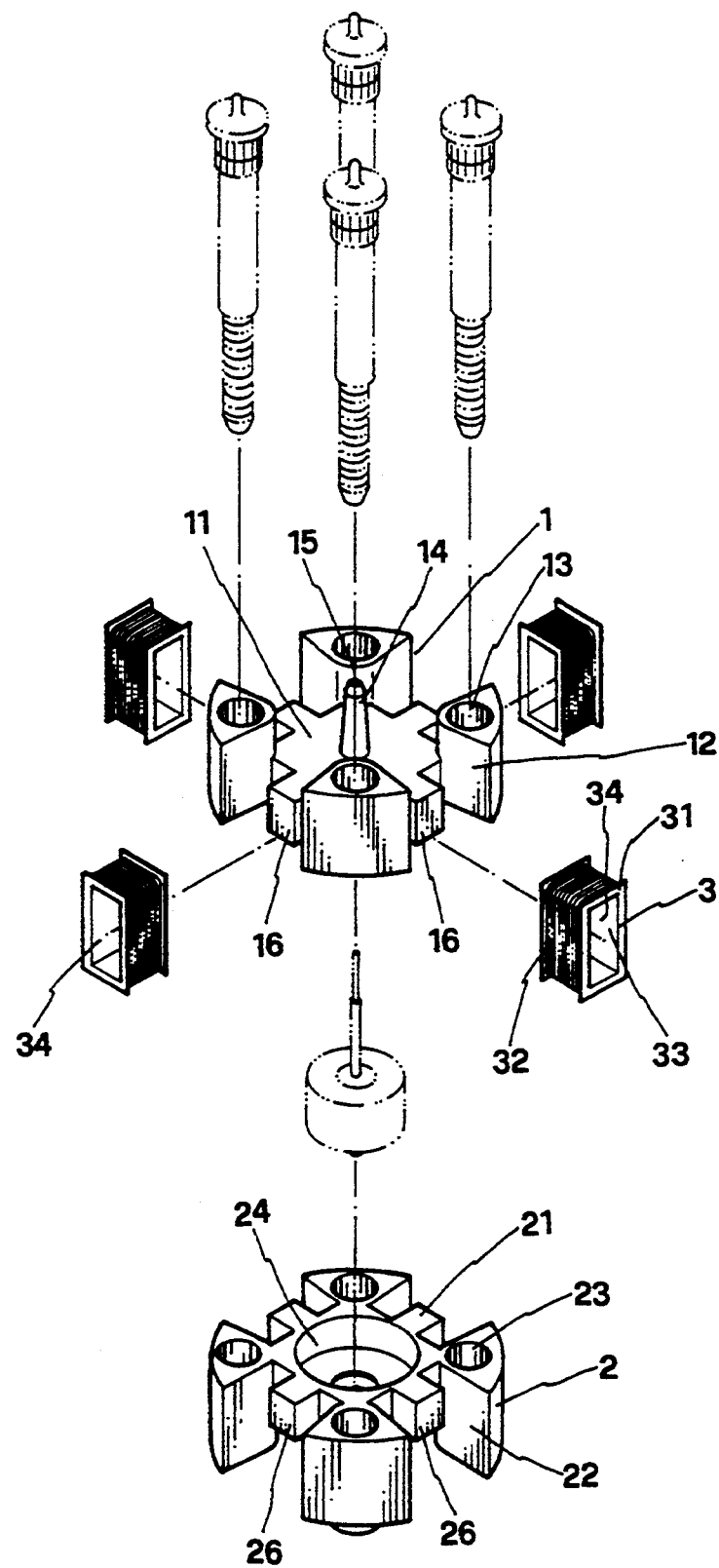
FIG. 2 is an exploded view of a detachable coils air core movement holder according to the present invention.

Referring to FIG. 2, a detachable coils air core movement holder in accordance with the present invention is generally comprised of an upper holder 1, a bottom holder 2, and a plurality of bobbins 3.

The upper holder 1 comprises a flat base plate 11 having a plurality of vertical bolt housings 12 and horizontal projections 16 alternatively disposed around the border at equal interval, and an upright hollow post 14 upstanding from the base plate 11 at the center, wherein each bolt housing 12 has a center through hole 13 through its length into which a respective copper bolt (as shown by imaginary line) inserts; the hollow post 14 has a center through hole 15 through its length.

The bottom holder 2 fits over the upper holder 1 at the bottom, comprising a plurality of vertical bolt housings 22 and horizontal projections 26 alternatively disposed around the border of a flat base plate 21 thereof at equal interval, and a recessed chamber 24 with a center blind hole 25 (not shown) on the top of the flat base plate 21 at the center, wherein each bolt housing 22 has a center through hole 23 through its length longitudinally aligned with the center through hole 13 on either bolt housing 12 of the upper holder 1. A magnet with a center shaft (as shown by imaginary line) is inserted in the recessed chamber 24 and retained between the top and bottom holders 1,2 with its center shaft extended out of the hollow post 14 and coupled to a pointer (this is similar to the prior art).

After the upper holder 1 and the bottom holder 2 connected in a stack, the horizontal projections 16 of the upper holder 1 are respectively connected to the horizontal projections 26 of the bottom holder 2 for mounting the bobbins 3.

Each bobbin 3 comprises a frame body 33 having two outward flanges 31,32 on two opposite ends thereof and a center through hole 34 through the frame body 33. Therefore, a coil can be wound round the frame body 33 and retained between the outward flanges 31,32.

Figure 3:
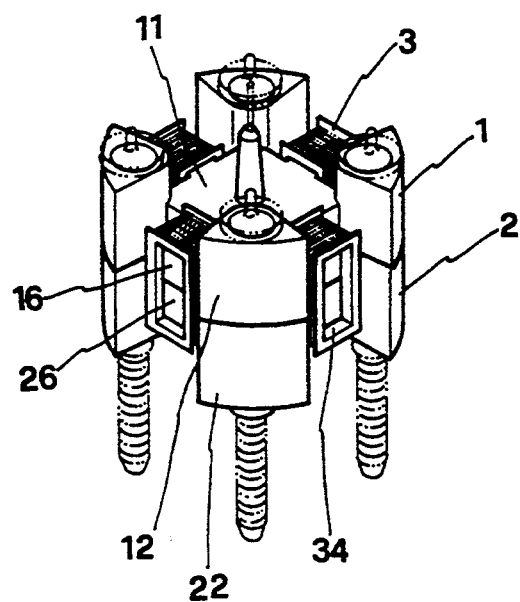
FIG. 3 is a perspective assembly view of the moving coil type movement holder of FIG. 2.

Referring to FIG. 3, when assembled, the bobbins 3 are respectively mounted on the horizontal projections 16, 26 and protected between the vertical bolt housings 12, 22. Because the coils are respectively wound round the bobbins 3 before the assembly process of the movement holder, the assembly process is easy. Because there is a flat, broad space around the hollow post 14, a zero-reading calibrating device may be mounted on the upper holder 1 for easy calibration. In case the movement fails to work properly, the bobbins 3 can be conveniently removed from the upper and bottom holders 1,2 for repair. Further, a magnetizing element may be respectively inserted in the center through hole 34 of each bobbin 3 to make up the deficit, if the intensity of magnetic field is insufficient during the production.

While only one embodiment of the present invention has been shown and described, it will be understood that various changes and modifications could be made thereunto without departing from the spirit and scope of the invention.

What is claimed is:

1. A detachable coils air core movement holder, comprising:

an upper holder, said upper holder comprising a plurality of vertical bolt housings equiangularly spaced around the border of a flat base plate thereof, and an upright hollow post upstanding from the flat base plate at the center;

a bottom holder fitted over said upper holder at the bottom, said bottom holder comprising a plurality of vertical bolt housings around the border of a flat base plate thereof respectively connected to the vertical bolt housings of said upper holder by conductive bolts, and a recessed chamber with a center blind hole at the top of the flat base plate at the center;

a center shaft connected to a magnet in said recessed chamber on said bottom holder and extended out of said hollow post and coupled to a pointer;

magnetic field generating means fastened to said upper and bottom holders and controlled to generate a magnetic field in turning said center shaft of said magnet;

wherein said upper and bottom holders have each a plurality of horizontal projections spaced around the respective border between either two contiguous bolt housings; said magnetic field generating means comprises a plurality of bobbins respectively mounted on the horizontal projections of said upper and bottom holders between, each bobbin comprising a frame body with two outward flanges on two opposite ends thereof for winding a coil, said frame body having a center through hole, which receives either horizontal projection of said upper holder and the corresponding horizontal projection of said bottom holder for positioning.

* * * * *